United States Patent
Park

(10) Patent No.: US 7,407,865 B2
(45) Date of Patent: Aug. 5, 2008

(54) EPITAXIAL GROWTH METHOD

(75) Inventor: Sung-soo Park, Seongnam-si (KR)

(73) Assignee: Samsung Corning Co., Ltd., Gyeonggi-Do (KR)

( * ) Notice: Subject to any disclaimer, the term of this patent is extended or adjusted under 35 U.S.C. 154(b) by 234 days.

(21) Appl. No.: 11/325,462

(22) Filed: Jan. 5, 2006

(65) Prior Publication Data

US 2006/0154451 A1    Jul. 13, 2006

(30) Foreign Application Priority Data

Jan. 7, 2005    (KR)    ............... 10-2005-0001541

(51) Int. Cl.
*H01L 21/76* (2006.01)
(52) U.S. Cl. ............... 438/442; 438/481; 257/E21.097; 257/E21.117; 257/E29.071
(58) Field of Classification Search ............... 438/962; 257/E29.071, E21.097, E21.117
See application file for complete search history.

(56) References Cited

U.S. PATENT DOCUMENTS

| | | | |
|---|---|---|---|
| 6,495,852 B1 * | 12/2002 | Mouri | 257/21 |
| 6,579,359 B1 | 6/2003 | Mynbaeva et al. | |
| 6,756,292 B2 * | 6/2004 | Lee et al. | 438/591 |
| 2005/0051766 A1 * | 3/2005 | Stokes et al. | 257/17 |

* cited by examiner

*Primary Examiner*—Ha Nguyen
*Assistant Examiner*—Chakila Tillie
(74) *Attorney, Agent, or Firm*—McDermott Will & Emery LLP

(57) ABSTRACT

An epitaxial growth method for forming a high-quality epitaxial growth semiconductor wafer is provided. The method includes forming a single crystalline layer on a single crystalline wafer; forming a mask layer having nano-sized dots on the single crystalline layer; forming a porous buffer layer having nano-sized pores by etching the mask layer and the surface of the single crystalline layer; annealing the porous buffer layer; and forming an epitaxial material layer on the porous buffer layer using an epitaxial growth process.

11 Claims, 3 Drawing Sheets

EPITAXIAL GROWTH METHOD

CROSS-REFERENCE TO RELATED PATENT APPLICATION

This application claims the benefit of Korean Patent Application No. 10-2005-0001541, filed on Jan. 7, 2005, in the Korean Intellectual Property Office, the disclosure of which is incorporated herein in its entirety by reference.

BACKGROUND OF THE DISCLOSURE

1. Field of the Disclosure

The present disclosure relates to an epitaxial growth method and more particularly, to a GaN epitaxial growth method.

2. Description of the Related Art

A substrate on which an epitaxial layer is formed using an epitaxial growth method may be bent and many crystalline defects may arise in the epitaxial layer due to lattice mismatch and a difference in the coefficient of thermal expansion between the substrate and the epitaxial layer. Thus, it is necessary to overcome the above-described problems while forming a single crystalline semiconductor material layer using the epitaxial growth method.

U.S. Pat. No. 6,579,359 discloses a technique of using a porous buffer layer that absorbs internal stress. In this technique, the porous buffer layer is formed on a SiC substrate, and an epitaxial layer is formed on the porous buffer layer. Since the buffer layer is porous, it absorbs stress induced by lattice mismatch.

However, since the porous buffer layer is formed using an anodization process, a conductive substrate should be employed, thus only limited kinds of materials may be used for the substrate. Also, the anodization method is very complex and costly.

SUMMARY OF THE DISCLOSURE

The present invention provides a method of forming a semiconductor epitaxial layer at low cost by easily forming a porous buffer layer.

According to an aspect of the present invention, there may be provided an epitaxial growth method including forming a single crystalline layer on a single crystalline wafer; forming a mask layer having nano-sized dots on the single crystalline layer; forming a porous buffer layer having nano-sized pores by etching the mask layer and the surface of the single crystalline layer; annealing the porous buffer layer; and forming an epitaxial material layer on the porous buffer layer using an epitaxial growth process.

In the present invention, the epitaxial material layer may be formed of a group III nitride semiconductor.

Also, the single crystalline wafer may be formed of one of Si, GaAs, SiC, GaN, and $Al_2O_3$. Preferably, the single crystalline wafer may be formed of $Al_2O_3$, and the single crystalline layer and the epitaxial material layer may be formed of GaN.

In one embodiment, the mask layer may be formed of Si, a metal such as Al, Co, Cr, and Pt, or an oxide of the metal.

In another embodiment, the mask layer may be formed of a material having a lower etch rate than the single crystalline layer.

The epitaxial material layer may be formed using a vapor deposition process, specifically, one of a halide or hydride vapor phase epitaxy (HVPE) process, a metal organic chemical vapor deposition (MOCVD), and a molecular beam epitaxy (MBE) process.

BRIEF DESCRIPTION OF THE DRAWINGS

The above and other features and advantages of the present invention are described in detailed exemplary embodiments thereof with reference to the attached drawings in which.

DETAILED DESCRIPTION OF EXEMPLARY EMBODIMENTS

An epitaxial growth method according to the present invention will now be described more fully hereinafter with reference to the accompanying drawings, in which exemplary embodiments of the invention are shown.

Figure 1:
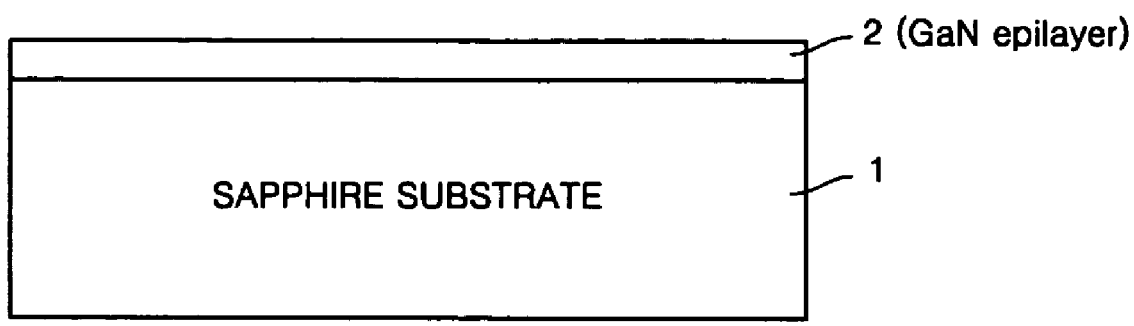
FIGS. 1 through 5 are cross-sectional views illustrating an epitaxial growth method according to an exemplary embodiment of the present invention.

Referring to FIG. 1, a single crystalline semiconductor layer 2, for example, a Group III nitride semiconductor layer, specifically, a GaN layer, (hereinafter, a GaN layer 2) is formed on a performed single crystalline wafer 1. In this case, the single crystalline wafer 1 may be formed of, for example, Si, GaAs, SiC, GaN, or $Al_2O_3$ (sapphire). Also, the GaN layer 2 may be formed by stacking a material of the same kind as the material of the wafer 1. For example, the GaN layer 2 may be formed by growing a GaN crystalline layer on a GaN wafer. Alternatively, the GaN layer 2 may be formed by stacking a material of a different kind from the material of the wafer 1. For example, the GaN layer 2 may be formed by growing a GaN crystalline layer on an $Al_2O_3$ wafer.

Specifically, to form the GaN layer 2, the $Al_2O_3$ wafer 1 is loaded in a halide or hydride vapor phase epitaxy (HVPE) reactor, and an internal temperature of the reactor is raised to a growth temperature of about 1050° C.

Thereafter, a Group III material and a Group IV material, namely, GaCl and $NH_3$, are mixed with $N_2$ gas in a ratio of 1:20, and the mixture is injected into the reactor for about 3 minutes so that the GaN layer 2 is grown on the $Al_2O_3$ wafer 1 to a thickness of 2 to 3 μm. After that, the reactor is cooled to a room temperature, and the $Al_2O_3$ wafer 1 on which the GaN layer 2 is formed is unloaded from the reactor.

Figure 2:
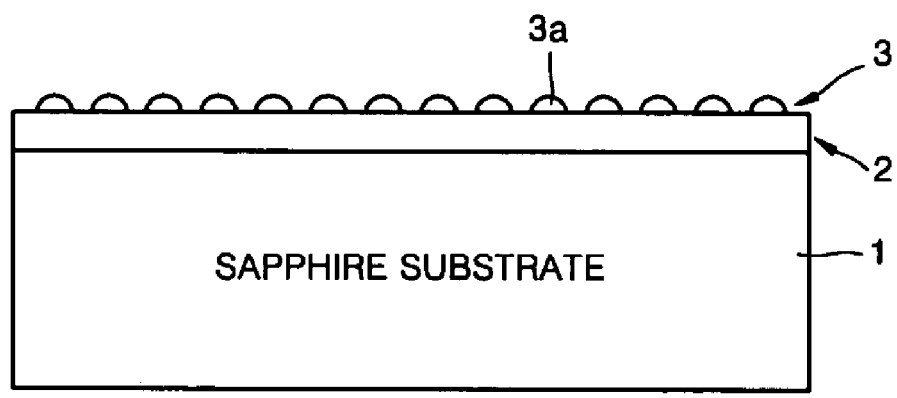

Referring to FIG. 2, a mask layer 3 having nano-sized dots 3a is formed on the GaN layer 2. The mask layer 3 may be formed of Si, a metal such as Al, Co, Cr, and Pt, or an oxide of the metal. When the mask layer 3 is formed of Si, it is obtained by depositing Si nanoparticles, which are formed using aerosol or pyrosis, on the GaN layer 2. When the mask layer 3 is formed of a metal, it is obtained using a deposition process. Also, when the mask layer 3 is formed of a metal oxide, it is obtained using a metal deposition process or oxidation process. The dots 3a of the mask layer 3 can be controlled in size by adjusting deposited thickness.

Figure 3:
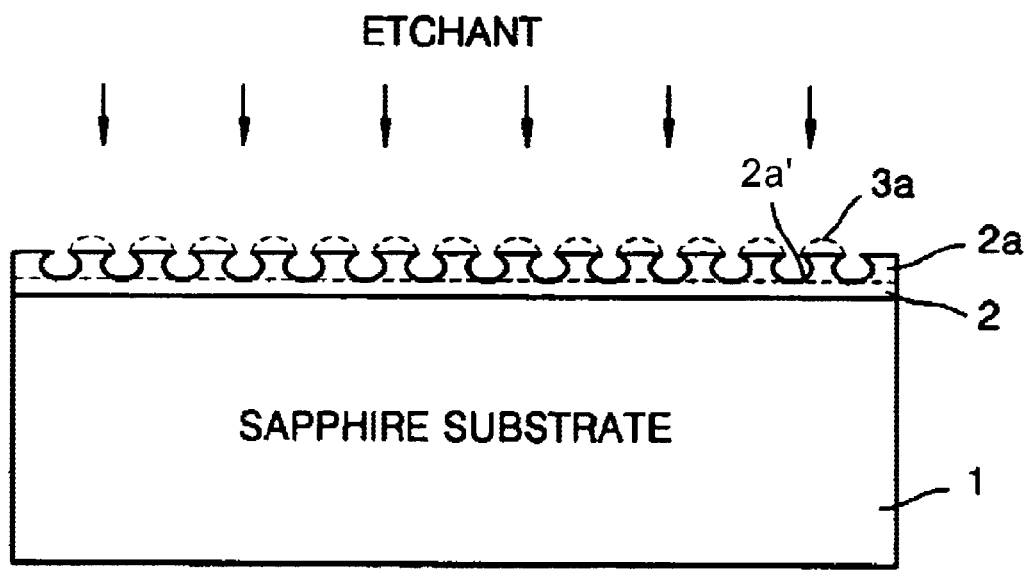

Referring to FIG. 3, a porous buffer layer 2a is formed on the GaN layer 2 using an etching process. In order to form the porous buffer layer 2a, an etchant having a higher solubility with respect to the GaN layer 2 than the mask layer 3 is employed. Accordingly, portions of the GaN layer 2, which are not covered with the dots 3a, are etched at a high rate, while the mask layer 3 is etched at a low rate. The etching process is continued until the mask layer 3 is completely removed and pores 2a' are formed to a diameter and depth of several tens of nm. As a result, as shown in FIG. 3, the porous buffer layer 2a having the nano-sized pores 2a' is formed to a predetermined thickness on the surface of the GaN layer 2.

Figure 4:
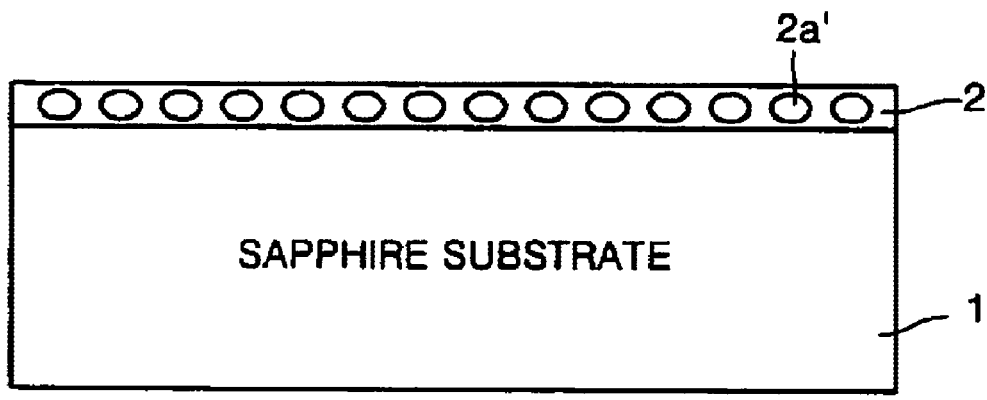

Referring to FIG. 4, the GaN layer 2 in which the porous buffer layer 2a is formed is annealed using a rapid thermal annealing (RTA) process. For this process, the $Al_2O_3$ wafer 1 is loaded in a furnace that is maintained in an $NH_3$ atmosphere and then is annealed at a temperature of approximately 850° C. or higher. As a result, the pores 2a' formed in the surface of the buffer layer 2a (i.e., formed on the GaN layer 2) are mostly shut, and the surface of the buffer layer 2a (i.e., the surface of the GaN layer 2) is flattened.

Figure 5:
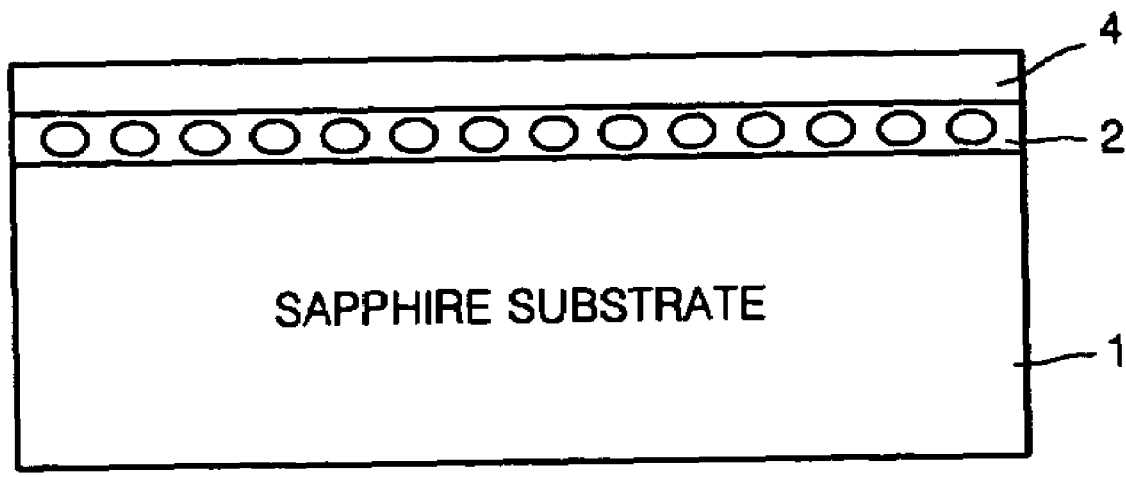

Referring to FIG. 5, a desired epitaxial material layer 4 is formed on the buffer layer 2a using a typical epitaxial growth process. The epitaxial material layer 4 may be formed of a material of the same kind as or a different kind from the underlying GaN layer 2. Preferably, the epitaxial material layer 4 may be formed of a Group III nitride semiconductor, for example, GaN, on the GaN layer 2. In this instance, the $Al_2O_3$ wafer 1 is loaded in the HVPE reactor, a reaction between HCl and Ga occurs, thus generating GaCl, and a reaction between GaCl and $NH_3$ gas occurs, thus growing the GaN epitaxial material layer 4 to a thickness of several μm on the surface of the GaN layer 2. During the epitaxial growth process, process conditions are controlled such that epitaxial growth rate measured in a horizontal direction is higher than epitaxial growth rate measured in a vertical direction.

Once the epitaxial growth process is finished, the HVPE reactor is cooled to a room temperature, and the $Al_2O_3$ wafer 1 on which the GaN semiconductor epitaxial material layer 4 is grown is unloaded from the HVPE reactor.

When a GaN epitaxial material layer was actually formed through the above-described processes, the following measurements were obtained. That is, the GaN epitaxial material layer had a defect density of about $5 \times 10^7/cm^2$ that is less than a conventional defect density of $5 \times 10^9$ $cm^2$ and had about ⅕ of a strain stress of a conventional GaN layer.

An optical device may be directly formed on the wafer 1 that has undergone the above-described processes. Alternately, to obtain a freestanding GaN wafer, the $Al_2O_3$ wafer 1 may be loaded again in the HVPE reactor and another GaN epitaxial material layer may be further grown on the GaN epitaxial material layer 4 to a thickness of about 300 μm or more. Subsequently, the $Al_2O_3$ wafer 1 may be removed using a known laser lift-off process, thus achieving a high-quality freestanding GaN wafer having a defect density of about $5 \times 10^5$ $cm^2$.

According to the present invention, an epitaxial material layer having a porous buffer layer is formed on a single crystalline wafer using an etching process. In particular, a mask layer is formed on the wafer to obtain the epitaxial material layer having the porous buffer layer. Since the porous buffer layer is formed using an etching process and an annealing process, the wafer can be formed of a wide variety of materials.

Also, the present invention reduces the defect density, stress, and bending degree of an epitaxial growth substrate, thus enabling formation of a high-quality semiconductor wafer at an increased yield. Further, owing to improvements in the above-described physical properties, it is possible to fabricate an epitaxial growth semiconductor wafer having a greater diameter.

In addition, the present invention is appropriate for a single crystalline semiconductor wafer that is formed dependently upon another substrate, for example, a Group III nitride semiconductor wafer such as a GaN wafer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An epitaxial growth method comprising:
   forming a single crystalline layer on a single crystalline wafer;
   forming a mask layer having nano-sized dots on the single crystalline layer;
   forming a porous buffer layer having nano-sized pores by etching the mask layer and the surface of the single crystalline layer;
   annealing the porous buffer layer; and
   forming an epitaxial material layer on the porous buffer layer using an epitaxial growth process.

2. The method according to claim 1, wherein the epitaxial material layer is formed of a Group III nitride semiconductor.

3. The method according to claim 1, wherein the single crystalline wafer is formed of one selected from the group consisting of Si, GaAs, SiC, GaN, and $Al_2O_3$.

4. The method according to claim 1, wherein the single crystalline wafer is formed of $Al_2O_3$, and the single crystalline layer and the epitaxial material layer are formed of GaN.

5. The method according to claim 4, wherein the mask layer is formed of one selected from the group consisting of Si, Al, Co, Cr, and Pt.

6. The method according to claim 1, wherein the mask layer is formed of a material having a lower etch rate than the single crystalline layer.

7. The method according to claim 1, wherein the epitaxial material layer is formed using a vapor deposition process.

8. The method according to claim 7, wherein the vapor deposition process is one selected from the group consisting of a halide or hydride vapor phase epitaxy (HVPE) process, a metal organic chemical vapor deposition (MOCVD), and a molecular beam epitaxy (MBE) process.

9. The method according to claim 1, wherein the annealing of the porous buffer layer is performed at a temperature of approximately 850° C. or higher.

10. The method according to claim 2, wherein the single crystalline wafer is formed of $Al_2O_3$, and the single crystalline layer and the epitaxial material layer are formed of GaN.

11. The method according to claim 3, wherein the single crystalline wafer is formed of $Al_2O_3$, and the single crystalline layer and the epitaxial material layer are formed of GaN.

* * * * *